United States Patent [19]
Lan et al.

[11] Patent Number: 6,113,736
[45] Date of Patent: Sep. 5, 2000

[54] GAS RING APPARATUS FOR SEMICONDUCTOR ETCHING

[75] Inventors: Shih-Tung Lan, Hsin-Chu; Sheng-Kai Chang, Ku-Keng Hsiang; Kuang-Yung Wu, Chung-Li; Shih-Chi Lai, Hsin-chu, all of Taiwan

[73] Assignee: Mosel Vitelic Inc., Hsin-Chu, Taiwan

[21] Appl. No.: 09/285,454

[22] Filed: Apr. 2, 1999

[51] Int. Cl.[7] .............................. H05H 1/00; C23C 16/00
[52] U.S. Cl. ............................................. 156/345; 118/728
[58] Field of Search ........................... 156/345; 118/728, 118/723 E, 722, 715, 716

[56] References Cited

U.S. PATENT DOCUMENTS 5,837,058  11/1998  Chen et al. ............................... 118/728

*Primary Examiner*—Shrive Beck
*Assistant Examiner*—Parviz Hassanzadeh
*Attorney, Agent, or Firm*—Bacon & Thomas

[57] ABSTRACT

A gas ring with curved surface on the edge of the gas-guiding trench of a gas ring apparatus is disclosed. The apparatus includes a ring-shaped body located on bottom of an etch chamber, wherein the ring-shaped body has a ring-shaped gas-guiding trench formed on the bottom surface and inside of the ring-shaped body, and wherein the intersection of sidewall of the ring-shaped gas-guiding trench and the bottom surface of the ring-shaped body has a curved bending surface. At least one gas hole extends from the top surface of the ring-shaped body to the ring-shaped gas-guiding trench. The apparatus also includes a first ring-shaped seal and a second ring-shaped seal situated on the bottom surface of the ring-shaped body. A blocking layer is formed to cover the surface of the ring-shaped body.

9 Claims, 2 Drawing Sheets

GAS RING APPARATUS FOR SEMICONDUCTOR ETCHING

BACKGROUND OF THE INVENTION

1. Field of the Invention

The present invention relates to a gas ring of an etching facility, and more particularly to a gas ring with curved surface on the edge of the gas-guiding trench thereof.

2. Description of the Prior Art

Etching technologies in the modem semiconductor industry primarily consist of wet etching and dry etching, wherein the dry etching usually includes physical type etching and chemical type etching. Specifically, the chemical type etching, also referred to as plasma etching, utilizes plasma to ionize the etch gas, thus generating ions, atoms, and radicals. Subsequently, the generated radicals react with the surface of the wafer under etch. In order to increase the plasma density, a magnetic field is introduced into the etch chamber in the modern magnetic-enhanced reactive ion etcher (MERIE). Moreover, for the purpose of reducing ion bombarding damage and increasing etching uniformity while maintaining high plasma density, another etch facility called transformer coupled plasma (TCP) is provided.

In a conventional etch facility, such as an etch equipment modeled LAM TCP 9400, etch gas such as $Cl_2$ and HCl are conducted into a gas ring located on the bottom of the etch chamber, and are then guided through gas holes, finally entering into the chamber for reaction.

FIG. 1A shows a cross-sectional view illustrative of a portion of a conventional gas ring, and a magnified view around the corner of a gas-guiding trench is shown in FIG. 1B. As shown in the figure, the gas ring 10, which is mainly composed of metal Al, is usually covered with an Aluminum oxide layer 20 for protection, so that its erosion and resultant containment can be prevented. Unfortunately, the thickness of the Aluminum oxide layer 20 around the corner 10a of the gas ring 10 (FIG. 1B) is usually too thin to act as a blocking layer, thereby resulting in severe erosion and containment.

For the foregoing reasons, there is a need for a gas ring apparatus for semiconductor etching, so that erosion can be substantially reduced, and the maintenance cost can be lowered.

SUMMARY OF THE INVENTION

In accordance with the present invention, a gas ring with curved surface on the edge of the gas-guiding trench of a gas ring apparatus is provided for substantially reducing erosion and maintenance cost. In one embodiment, the present invention includes a ring-shaped Al body located on bottom of an etch chamber, wherein the ring-shaped body has a ring-shaped gas-guiding trench with inverted-U shaped cross-section formed on the bottom surface and inside of the ring-shaped body, and wherein the intersection of sidewall of the ring-shaped gas-guiding trench and bottom surface of the ring-shaped body has a curved bending surface at an angle of about 45 degrees thereto. In the embodiment of the present invention, at least one gas hole extends from the top surface of the ring-shaped body to the ring-shaped gas-guiding trench. A first ring-shaped seal is situated on the bottom surface of the ring-shaped body, wherein the first ring-shaped seal is approximately concentric to the ring-shaped gas-guiding trench, and diameter of the first ring-shaped seat is larger than diameter of the ring-shaped gas-guiding trench. Furthermore, a second ring-shaped seal is situated on the bottom surface of the ring-shaped body, wherein the second ring-shaped seal is approximately concentric to the ring-shaped gas-guiding trench, and diameter of the second ring-shaped seat is smaller than diameter of the ring-shaped gas-guiding trench. Finally, a blocking layer containing Aluminum oxide is formed to cover main portion of the ring-shaped body.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

In the embodiment of the present invention, a transformer coupled plasma (TCP) etch apparatus modeled LAM TCP 9400 is used. However, it is appreciated that other etch apparatus having similar structure can be used. This type of etch apparatus generally has a chamber, wherein the etching takes place. A wafer under etch is placed on a wafer carrier located on the bottom of the chamber, and the etching side of the wafer faces upward. Etch gas is conducted through gas holes of the gas ring into the chamber in a bottom-up direction.

Figures 1A, 1B:
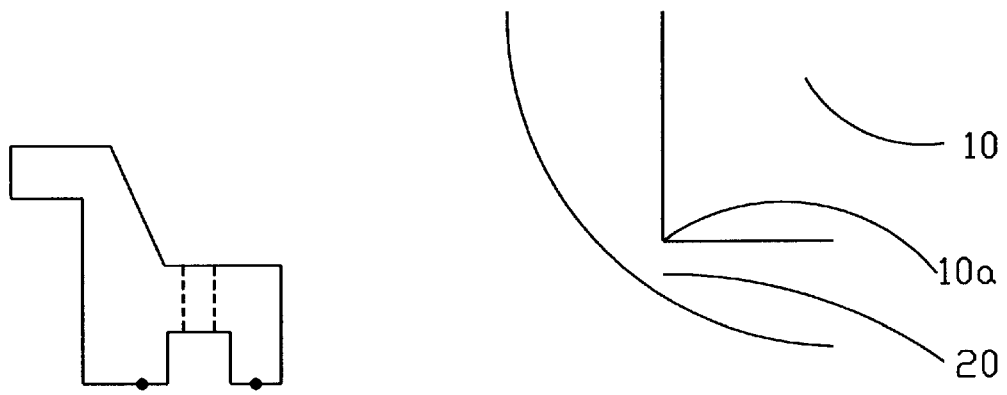
FIG. 1A shows a cross-sectional view illustrative of a portion of a conventional gas ring.
FIG. 1B shows a magnified view of FIG. 1A around the corner of a gas-guiding trench.
Figure 2:
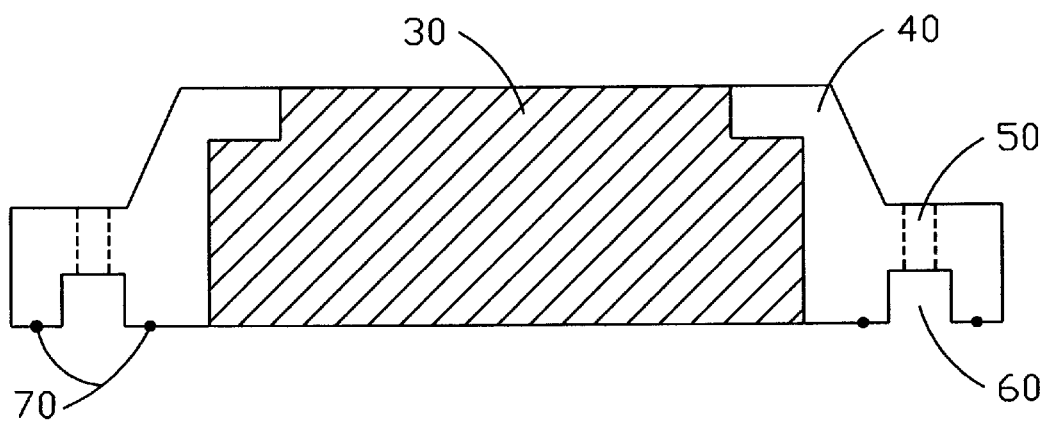
FIG. 2 shows a cross-sectional view illustrative of the gas ring apparatus according to one embodiment of the present invention.

A detailed cross-section is shown in FIG. 2, where the main body of the gas ring 40 surrounds the wafer carrier 30. In this embodiment, the gas ring 40 is mainly composed of metal Al.

Figure 3:
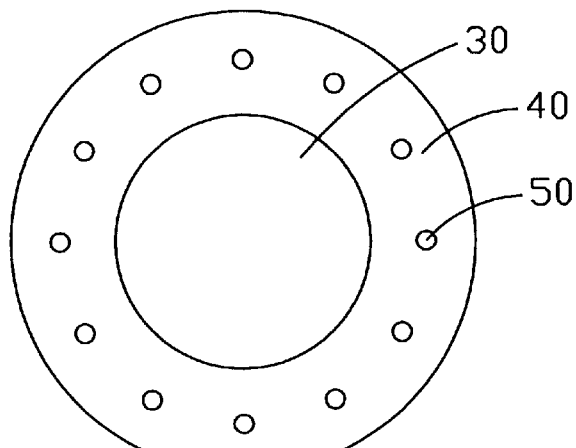
FIG. 3 shows the top surface of the gas ring according to the present invention.

FIG. 3 shows the top surface of the gas ring 40, which is set inside the etch chamber. The gas ring 40 contains some gas holes 50 extending from the top surface of the gas ring 40. While etching, etch gas is conducted into the etch chamber through these gas holes 50. The wafer under etch is placed on the wafer carrier 30 with the etching side of the wafer facing upward, eventually reacting with the etch gas.

Figure 4:
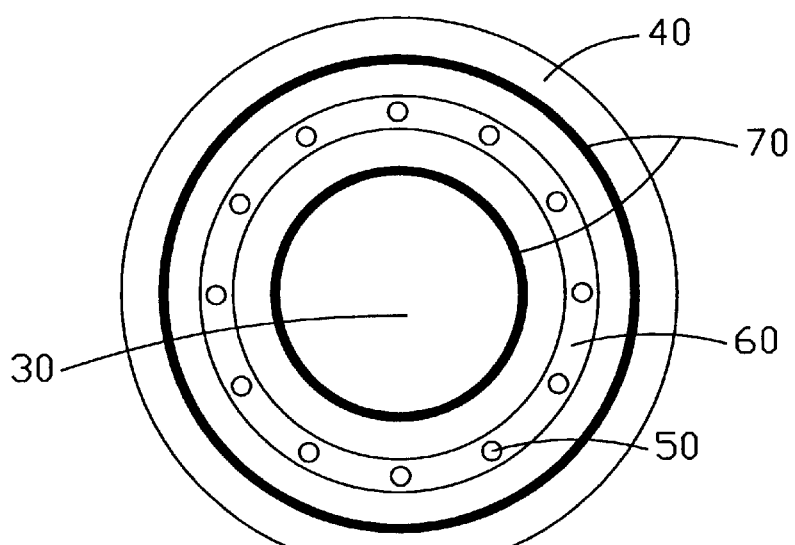
FIG. 4 shows the bottom surface of the gas ring according to the present invention.

FIG. 4 shows the bottom surface of the gas ring 40, which is usually set outside the chamber. On and inside the bottom surface of the gas ring 40 contains a ring-shaped gas-guiding trench 60, wherein the aforementioned gas holes 50 are further extended into this gas-guiding trench 60. The gas-guiding trench 60 in this embodiment has an inverted-U shape cross-section, while other shape such as inverted-V shape or semicircle can also be adapted. Consequently, further into the chamber in a bottom-up direction. Moreover, there are two concentric ring seals 70 situated on the bottom side of the gas ring 40 for the purpose of preventing the etch gas from being escaped. The outer seal has a diameter larger than that of the gas-guiding trench 60, and the inner seal has a diameter smaller than that of the gas-guiding trench 60.

Due to the fact that the surface of the gas ring 40 is severely subject to the erosion of the etch gas, a blocking layer such as Aluminum oxide layer is conventionally formed and covered on the surface of the gas ring 40.

Figure 5:
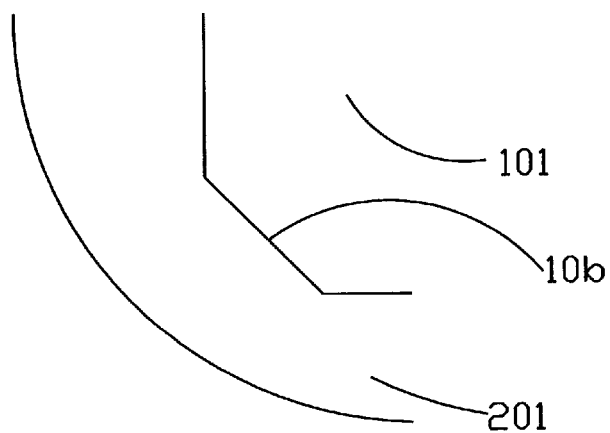
FIG. 5 demonstrates a cross-sectional view illustrative of the curved surface of the gas-guiding trench of the present invention.

According to the discovering of the peeling off occurred on the edge of the gas-guiding trench 60 in the prior art, the intersection of the sidewall of the gas-guiding trench 60 and the bottom surface of the main body of the gas ring 101 is preferably made to possess a curved bending surface like a 45 degree angle, a smooth radian, and a multiple angle. In this embodiment, as demonstrated in FIG. 5, the curved bending surface 10*b* is at an angle of about 45 degrees to the bottom surface of the gas ring 101. Unlike the right-angle edge in the prior art, the curved surface in the present invention provides a thicker and more uniform metal oxide layer 201, substantially blocking the erosion by the etch gas. Therefore, the peelings no longer contaminate the chamber, thus preserving cost and time of maintenance.

Although specific embodiments have been illustrated and described, it will be obvious to those skilled in the art that various modifications may be made without departing from what is intended to be limited solely by the appended claims.

What is claimed is:

1. A gas ring apparatus for semiconductor etching, said apparatus comprising:

a ring-shaped metal body located on bottom of an etch chamber;

a metal oxide blocking layer covering the entire surface of said ring-shaped body;

wherein said ring-shaped body has a ring-shaped gas-guiding trench formed on bottom surface and inside of said ring-shaped body, and wherein intersection of sidewall of said ring-shaped gas-guiding trench and the bottom surface of said ring-shaped body has a curved bending surface, so that the covered blocking layer has a thickness substantially enough to prevent erosion of the metal surface around said intersection in an etch process;

at least one gas hole extending from top surface of said ring-shaped body to said ring-shaped gas-guiding trench;

a first ring-shaped seal situated on the bottom surface of said ring shaped body, said first ring-shaped seal being approximately concentric to said ring-shaped gas-guiding trench, and diameter of said first ring-shaped seat being larger than diameter of said ring-shaped gas-guiding trench; and a second ring-shaped seal situated on the bottom surface of said ring-shaped body, said second ring-shaped seal being approximately concentric to said ring-shaped gas-guiding trench, and diameter of said second ring-shaped seat being smaller than diameter of said ring-shaped gas-guiding trench.

2. The apparatus according to claim 1, wherein said metal comprises Al.

3. The apparatus according to claim 1, wherein cross-section of said ring-shaped gas-guiding trench has one of following shapes: inverted-U shape, semicircle, and inverted-V shape.

4. The apparatus according to claim 1, wherein said curved bending surface is at an angle of about 45 degrees to the bottom surface of said ring-shaped body.

5. The apparatus according to claim 1, wherein said first ring-shaped seal is used to prevent etch gas from being escaped.

6. The apparatus according to claim 1, wherein said second ring-shaped seal is used to prevent etch gas from being escaped.

7. The apparatus according to claim 1, wherein said metal oxide comprises Aluminum oxide.

8. The apparatus according to claim 1, wherein said curved bending surface is selected from the group consisting of a 45 degree angle, a smooth radian, and a multiple angle.

9. A gas ring apparatus for semiconductor etching, said apparatus comprising:

a ring-shaped Al body located on bottom of an etch chamber;

a blocking layer containing Aluminum oxide, which covers the entire surface of said ring-shaped body;

wherein said ring-shaped body has a ring-shaped gas-guiding trench with inverted-U shaped cross-section formed on bottom surface and inside of said ring-shaped body, and wherein intersection of sidewall of said ring-shaped gas-guiding trench and the bottom surface of said ring-shaped body has a curved bending surface at an angle of about 45 degrees thereto, so that the covered blocking layer has a thickness substantially enough to prevent erosion of the metal surface around said intersection in an etch process;

at least one gas hole extending from top surface of said ring-shaped body to said ring-shaped gas-guiding trench;

a first ring-shaped seal situated on the bottom surface of said ring-shaped body, said first ring-shaped seal being approximately concentric to said ring-shaped gas-guiding trench, and diameter of said first ring-shaped seat being larger than diameter of said ring-shaped gas-guiding trench; and a second ring-shaped seal situated on the bottom surface of said ring-shaped body, said second ring-shaped seal being approximately concentric to said ring-shaped gas-guiding trench, and diameter of said second ring-shaped seat being smaller than diameter of said ring-shaped gas-guiding trench.

* * * * *